United States Patent
Numanami

(10) Patent No.: US 8,956,463 B2
(45) Date of Patent: Feb. 17, 2015

(54) METHOD FOR CLEANING PHOTOMASK-RELATED SUBSTRATE, CLEANING METHOD, AND CLEANING FLUID SUPPLYING APPARATUS

(75) Inventor: Tsuneo Numanami, Jyoetsu (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 690 days.

(21) Appl. No.: 12/585,036

(22) Filed: Sep. 1, 2009

(65) Prior Publication Data

US 2010/0083985 A1    Apr. 8, 2010

(30) Foreign Application Priority Data

Oct. 8, 2008   (JP) ................... 2008-261478
Nov. 11, 2008  (JP) ................... 2008-288548
Nov. 11, 2008  (JP) ................... 2008-288603

(51) Int. Cl.
   *B08B 3/10*   (2006.01)
   *G03F 1/82*   (2012.01)

(52) U.S. Cl.
   CPC ............... *G03F 1/82* (2013.01); *Y10S 134/902* (2013.01)
   USPC ............................................. 134/10; 134/902

(58) Field of Classification Search
   USPC ............................................. 134/10; 210/767
   See application file for complete search history.

(56) References Cited

U.S. PATENT DOCUMENTS

| | | | | |
|---|---|---|---|---|
| 4,734,201 A | * | 3/1988 | Watanabe | 210/685 |
| 5,124,033 A | * | 6/1992 | Ohmi et al. | 210/181 |
| 5,422,013 A | * | 6/1995 | Hirofuji | 210/739 |
| 5,795,494 A | | 8/1998 | Hayami et al. | |
| 7,186,301 B2 | * | 3/2007 | Kim et al. | 134/26 |
| 8,235,068 B2 | * | 8/2012 | Christenson | 137/624.11 |
| 2006/0019177 A1 | | 1/2006 | Mori et al. | |
| 2006/0207633 A1 | | 9/2006 | Kim et al. | |
| 2008/0006291 A1 | * | 1/2008 | Watanabe | 134/1.3 |
| 2008/0236639 A1 | | 10/2008 | Kimura et al. | |

FOREIGN PATENT DOCUMENTS

| | | |
|---|---|---|
| CN | 201079709 Y | 7/2008 |
| JP | A-08-172068 | 7/1996 |

(Continued)

OTHER PUBLICATIONS

Chinese Office Action issued in Chinese Application No. 200910179006.9 dated May 18, 2011 (with partial translation).

(Continued)

*Primary Examiner* — Michael Kornakov
*Assistant Examiner* — Natasha Campbell
(74) *Attorney, Agent, or Firm* — Oliff PLC

(57) ABSTRACT

A method for cleaning a photomask-related substrate, when the photomask-related substrate is contaminated by a sulfate ion. The photomask-related substrate is cleaned with pure water to remove the sulfate ion, and a deaerating step of removing dissolved gas is performed in advance on the pure water used for cleaning. When the substrate to be cleaned is cleaned by filtering the cleaning fluid with a filter for removing foreign matter and supplying the filtered cleaning fluid to the cleaning apparatus through a supply pipe, prior to a supply of the filtered cleaning fluid to the cleaning apparatus, the filtered cleaning fluid is discharged to the outside of a system through a discharge pipe, and then the filtered cleaning fluid is supplied to the cleaning apparatus through the supply pipe.

6 Claims, 4 Drawing Sheets

(56) References Cited

FOREIGN PATENT DOCUMENTS

| | | |
|---|---|---|
| JP | A-10-004074 | 1/1998 |
| JP | A-10-305248 | 11/1998 |
| JP | A-11-302689 | 11/1999 |
| JP | A-2001-96241 | 4/2001 |
| JP | A-2001-149873 | 6/2001 |
| JP | A-2002-035704 | 2/2002 |
| JP | A-2002-151453 | 5/2002 |
| JP | A-2004-19993 | 1/2004 |
| JP | A-2004-19994 | 1/2004 |
| JP | A-2004-53817 | 2/2004 |
| JP | A-2005-202135 | 7/2005 |
| JP | A-2006-011048 | 1/2006 |
| JP | A-2007-152207 | 6/2007 |
| JP | A-2007-258367 | 10/2007 |
| KR | 2008-0087690 | 10/2008 |

OTHER PUBLICATIONS

May 22, 2012 Japanese Office Action issued in JP-2008-288548 (with partial English-language Translation).

May 22, 2012 Japanese Office Action issued in JP-2008-288603 (with partial English-language Translation).

Apr. 11, 2012 Chinese Office Action issued in Chinese Patent Application No. 200910179006.9 (with partial English translation).

Jul. 3, 2012 Notification of Reasons for Refusal issued in Japanese Patent Application No. 2008-261478 and corresponding to U.S. Appl. No. 12/585,036 (with translation).

Aug. 23, 2012 Office Action issued in Chinese Patent Application No. 201110303742.8 (with partial translation).

Oct. 25, 2012 Office Action issued in Chinese Patent Application No. 200910179006.9 (with partial translation).

Decision of Refusal issued Dec. 4, 2012 in Japanese Patent Application No. 2008-261478 (with translation).

Apr. 9, 2013 Japanese Office Action issued in Jp 2008-288548 with partial English-language Translation.

Apr. 9, 2013 Japanese Office Action issued in Jp 2008-288603 with partial English-language Translation.

Sep. 23, 2014 Office Action issued in Korean Patent Application No. 10-2009-0092556 (with Partial English Translation).

\* cited by examiner

NOZZLE (POINT OF USE)

PHOTOMASK-RELATED SUBSTRATE

METHOD FOR CLEANING PHOTOMASK-RELATED SUBSTRATE, CLEANING METHOD, AND CLEANING FLUID SUPPLYING APPARATUS

BACKGROUND OF THE INVENTION

1. Field of the Invention

The present invention relates to a method for cleaning a photomask-related substrate selected from a substrate for a photomask, a photomask blank, a photomask, and a production intermediate thereof, and, more particularly to removal of a sulfate ion attached to the surface of a photomask-related substrate and inhibition of the generation of a particle.

2. Description of the Related Art

A photomask used for wide applications including production of a semiconductor integrated circuit such as an IC, an LSI, or a VLSI, and other is basically obtained by processing a light shielding film of a photomask blank having the light shielding film formed of a thin film containing metal or a metal compound, the light shielding film formed on a translucent substrate (a substrate for a photomask), into a predetermined light shielding film pattern by using electron-beam photolithography or the like.

In recent years, patterns have rapidly become finer and finer to meet the market demands for higher-density semiconductor integrated circuits and the like. Against this background, measures are taken by planning the matter that the exposure wavelength is shortened and the numerical aperture of a lens is increased to increase the resist resolution in an exposure process.

In photolithography method used for production or the like of the semiconductor integrated circuit described above, as an original drawing used for printing a circuit pattern on a photoresist, a photomask having a light shielding part made of a metal compound, the light shielding part formed on a substrate which is transparent with respect to exposure light is used.

However, as the photomask has come to be used for exposure of an extremely fine pattern, even extremely fine foreign matter and haze (cloudiness) become a defect. Therefore, the photomask and a material for producing the photomask are required to be extremely clean.

The photomask such as a binary mask having a light shielding part that blocks exposure light almost completely and a halftone phase-shift mask that prevents a reduction in contrast caused by diffraction of the exposure light by inverting the phase of light with respect to a light transmission part while attenuating the light has become commercially practical. These photomasks have a light shielding part made of a chromium compound or a metal silicide compound on a transparent substrate made of quartz, $CaF_2$, or the like.

Moreover, the photomask is produced by forming a thin film made of the above-described light shielding film material on the transparent substrate described above, forming a resist pattern thereon by electron-beam lithography or the like, and transferring the pattern to a light shielding material by etching. As described above, the photomask is required to have an extremely high degree of cleanliness, precise cleaning is performed in each process.

However, the use of a high-energy beam such as ArF excimer laser light as exposure light causes a phenomenon in which a sulfate ion and an ammonium ion remaining on the substrate form an ammonium sulfate microcrystal, and this microcrystal becomes a particle and is counted as a defect. Such a phenomenon has become a problem (for example, see Japanese Unexamined Patent Publication (Kokai) No. 2005-202135). Although the method by which a photomask material is rinsed with heated pure water has been proposed earlier in Japanese Unexamined Patent Publication (Kokai) No. 2004-19994 by the applicant of the present invention, it has been shown in Japanese Unexamined Patent Publication (Kokai) No. 2004-53817 that this method in which hot water is used is more effective in removing a sulfate ion as compared to a case in which cleaning is performed by using room-temperature water.

However, even when cleaning is performed by using heated pure water as described above, a particle is generated after drying the substrate.

Moreover, cleaning of a substrate made of quartz, $CaF_2$, or the like, for producing a photomask blank or cleaning of a photomask blank is performed as follows. After cleaning using a surface-active agent is performed, multistage cleaning using hydrogen water or ozone water is performed, and rinsing using ultrapure water is performed in each stage as needed (for example, see Japanese Unexamined Patent Publication (Kokai) No. 2001-96241 and Japanese Unexamined Patent Publication (Kokai) No. 2002-151453).

On the other hand, even when the above-described multistage cleaning is performed, the obtained substrate is not always unconditionally clean, and fine foreign matter is generated at significant frequency. For example, when a drying method is not appropriate, contamination (foreign matter) sometimes occurs when removing a water droplet by drying (see Japanese Unexamined Patent Publication (Kokai) No. 2004-19993).

SUMMARY OF THE INVENTION

The present invention has been made in view of the above problems, and an object thereof is to provide a cleaning method that can increase cleaning efficiency for a sulfate ion in a simple and easy way and further can reduce the generation of minute foreign matter (particle) extremely when a photomask-related substrate selected from a substrate for a photomask, a photomask blank, a photomask, and a production intermediate thereof is cleaned, and to provide a cleaning fluid supplying apparatus supplying a cleaning fluid to a cleaning apparatus.

To solve the above problems, the invention provides a method for cleaning a photomask-related substrate, wherein, when a photomask-related substrate contaminated by a sulfate ion, the photomask-related substrate being selected from a substrate for a photomask, a photomask blank, a photomask, and a production intermediate thereof, is cleaned with pure water, a deaerating step of removing dissolved gas by deaeration is performed in advance on the pure water used for cleaning.

With the photomask-related substrate cleaning method of the invention, when a photomask-related substrate contaminated by a sulfate ion is cleaned with pure water, since the deaerating step of removing dissolved gas by deaeration is performed in advance on the pure water used for cleaning, it is possible to supply deaerated pure water as a cleaning fluid, and remove the sulfate ion attached to the surface of the photomask-related substrate due to, for example, sulfur dioxide or the like in the atmosphere efficiently. Furthermore, the method can be performed easily.

Conventionally, a method by which the pure water is heated to remove the sulfate ion has been used. However, with the invention, the sulfate ion can be sufficiently removed without taking the trouble to heat the pure water.

Therefore, it is possible to inhibit the generation of a particle due to, in particular, a sulfate ion significantly, and provide a high-quality photomask-related substrate.

At this time, it is possible that on the pure water used for cleaning, a deaerating step of removing dissolved gas by deaeration and a heating step of heating the pure water are performed in advance.

With the photomask-related substrate cleaning method of the invention, when a photomask-related substrate contaminated by a sulfate ion is cleaned with pure water, since, on the pure water used for cleaning, the heating step of heating the pure water is performed in advance, that is, since the heated pure water is supplied as a cleaning fluid, it is possible to remove the sulfate ion attached to the surface of the photomask-related substrate due to, for example, sulfur dioxide or the like in the atmosphere efficiently.

In addition, since the deaerating step of removing dissolved gas by deaeration is also performed, it is possible to remove the sulfate ion more efficiently.

Furthermore, it is possible to inhibit the generation of a particle on the substrate surface, the particle which would be generated after drying the cleaned substrate.

In conventional cleaning using heated pure water, a particle is generated after drying the substrate. On the other hand, in the invention, since the pure water subjected not only to the heating step but also to the deaerating step is used for cleaning, it is possible to remove the sulfate ion and inhibit the generation of a particle after drying the substrate cleaned with the heated water.

Furthermore, the method can be performed easily.

At this time, it is possible that the pure water used for cleaning is heated to 55° C. or higher by performing the heating step.

When the pure water heated to 55° C. or higher is used for cleaning, in the conventional method, a problem of the generation of a particle after drying the substrate easily arises. By contrast, even when the pure water is heated to that temperature, the cleaning method of the invention makes it possible to inhibit the generation of a particle after drying the cleaned substrate. It is possible to achieve the effect of the invention more effectively.

In particular, it is possible that the photomask-related substrate to be cleaned with the pure water is a photomask-related substrate treated with sulfuric acid or a material containing sulfate.

As described above, since the photomask-related substrate to be cleaned with the pure water is first treated with sulfuric acid or a material containing sulfate, it is possible to remove an organic substance or the like on the surface of the photomask-related substrate by cleaning inexpensively and effectively.

The cleaning method of the invention is also effective for such a photomask-related substrate treated with sulfuric acid or a material containing sulfate, and, even when a sulfate ion is attached to the substrate surface due to a residue of sulfuric acid or the like, it is possible to remove the sulfate ion efficiently.

At this time, it is possible that, when cleaning with the pure water is performed, the cleaning is performed by pouring flowing pure water on the photomask-related substrate.

It is preferable that the pure water subjected to the deaerating step is used for cleaning after being exposed to the air or other gases as little as possible after deaeration. Therefore, by performing cleaning by using flowing pure water as described above, the amount of time during which the pure water is exposed to the air or the like is reduced, making it possible to make good use of the effect obtained by removal of dissolved gas by deaeration, the effect of removing the sulfate ion efficiently, and achieve a higher degree of cleaning efficiency.

Moreover, it is preferable that the deaerating step is performed by using a gas-liquid separation film.

As described above, by performing the deaerating step by using the gas-liquid separation film, the pure water is less subject to contamination by a particle or an ion, and it is possible to deaerate a large volume of pure water efficiently.

In addition, it is preferable that a dissolved oxygen concentration of the pure water used for cleaning is reduced to 1 ppm or less by performing the deaerating step.

As a measure of the deaerated state of dissolved gas, dissolved oxygen can be used as an indicator. Generally, when no special treatment is performed on the pure water, the dissolved oxygen concentration is on the order of 8 ppm. By reducing the dissolved oxygen concentration to 1 ppm or less by performing the deaerating step, it is possible to remove the sulfate ion more effectively.

Furthermore, it is possible that, on the pure water used for cleaning, a foreign matter removing step of removing foreign matter by using a filter is additionally performed.

By additionally performing the foreign matter removing step using the filter, it is possible to remove fine foreign matter in the pure water and inhibit the generation of a defect in the cleaned substrate, the defect caused by the foreign matter.

By the photomask-related substrate cleaning method of the invention, by performing cleaning with the pure water on a photomask-related substrate contaminated by a sulfate ion, it is possible to remove the sulfate ion attached to the surface of the photomask-related substrate. Moreover, it is possible to remove the sulfate ion efficiently and easily.

Moreover, the invention provides a method for cleaning a substrate to be cleaned by supplying a cleaning fluid to a cleaning apparatus, wherein, when the substrate to be cleaned is cleaned by filtering the cleaning fluid with a filter for removing foreign matter and supplying the filtered cleaning fluid to the cleaning apparatus through a supply pipe, at least, prior to a supply of the filtered cleaning fluid to the cleaning apparatus, the filtered cleaning fluid is discharged to an outside of a system through a discharge pipe, and then the filtered cleaning fluid is supplied to the cleaning apparatus through the supply pipe.

With this cleaning method, since, prior to a supply of the filtered cleaning fluid to the cleaning apparatus, the filtered cleaning fluid is discharged to the outside of the system through the discharge pipe, and then the filtered cleaning fluid is supplied to the cleaning apparatus through the supply pipe, even when a fine bubble is generated in the built-up cleaning fluid after filtration while the supply of the cleaning fluid to the cleaning apparatus is stopped, for example, it is possible to discharge the cleaning fluid containing the fine bubble to the outside of the system in advance. This makes it possible to reduce the amount of fine bubbles in the cleaning fluid as compared to the conventional method at the time of supplying the cleaning fluid to the cleaning apparatus, inhibit the generation of a minute foreign matter defect caused by the cleaning of the substrate and resulting from the fine bubble significantly, and thereby improve productivity and yields.

In particular, it is desirable that, when the substrate to be cleaned is cleaned by supplying the filtered cleaning fluid to the cleaning apparatus through the supply pipe, at least, the filtered cleaning fluid is discharged to the outside of the system through the discharge pipe, and then the cleaning fluid be continuously discharged from the discharge pipe, until the filtered cleaning fluid starts to be supplied to the cleaning apparatus through the supply pipe.

With this cleaning method, since the filtered cleaning fluid is discharged to the outside of the system through the discharge pipe and then the cleaning fluid is continuously discharged from the discharge pipe until the filtered cleaning fluid starts to be supplied to the cleaning apparatus through the supply pipe, even when a fine bubble is generated in the built-up cleaning fluid after filtration, it is possible to discharge the cleaning fluid containing the fine bubble to the outside of the system. As a result, it is possible to prevent the cleaning fluid containing the fine bubble from being conveyed to the cleaning apparatus. This makes it possible to achieve further inhibition of the generation of a minute foreign matter defect caused by the cleaning of the substrate and resulting from the fine bubble, and thereby improve productivity and yields.

At this time, it is possible that after the filtered cleaning fluid starts to be supplied, the filtered cleaning fluid is continuously discharged through the discharge pipe at the same time while being supplied through the supply pipe.

By doing so, it is possible to prevent the cleaning fluid from building up more reliably, inhibit the generation of a bubble, and supply the cleaning fluid containing no bubble to the cleaning apparatus.

Moreover, it is possible that when a supply of the filtered cleaning fluid to the cleaning apparatus is stopped, the filtered cleaning fluid is continuously discharged through the discharge pipe.

By doing so, since the cleaning fluid filtered by the filter is discharged to the outside of the system even when the supply to the cleaning apparatus is stopped, the filtered cleaning fluid is virtually prevented from building up. This makes it possible to inhibit the generation of a fine bubble at the time of the next supply.

Furthermore, it is possible that until cleaning of every substrate to be cleaned is completed, the filtered cleaning fluid is continuously discharged through the discharge pipe.

By doing so, the filtered cleaning fluid filtered by the filter is prevented from building up, and it is extremely easy to control the discharge of the cleaning fluid to the outside of the system. This makes it possible to simplify the operation.

Moreover, it is preferable that when the filtered cleaning fluid is supplied to the cleaning apparatus, a height position of an inlet of the discharge pipe is above a height position of an inlet of the supply pipe.

By doing so, it is possible to guide a fine bubble generated in the filtered cleaning fluid to the discharge pipe more efficiently, and prevent the cleaning fluid containing a bubble from being supplied to the cleaning apparatus more.

In addition, it is possible that the substrate to be cleaned is any one of a transparent substrate for a photomask, a photomask blank, a photomask blank production intermediate, and a photomask.

As described above, by applying the cleaning method of the invention to those requiring-precise cleaning, it is possible to provide a transparent substrate for a photomask, a photomask blank, a photomask blank production intermediate, and a photomask which suffer less from the generation of foreign matter than conventional ones in response to market demands.

In these cleaning methods of the invention, it is possible that, as the cleaning fluid, ultrapure water is used.

A cleaning failure caused by a fine bubble tends to occur at the time of rinsing with ultrapure water, in particular. Thus, by applying the invention to cleaning with ultrapure water, the generation of fine foreign matter at the time of cleaning can be exceedingly inhibited.

Moreover, the invention provides a cleaning fluid supplying apparatus supplying a cleaning fluid to a cleaning apparatus cleaning a substrate to be cleaned, the cleaning fluid supplying apparatus including at least: a filter for removing foreign matter from the cleaning fluid; a supply pipe for supplying the cleaning fluid to the cleaning apparatus; a discharge pipe for discharging the cleaning fluid to an outside of a system; and a valve provided for each of the supply pipe and the discharge pipe for controlling an amount of the cleaning fluid, wherein the supply pipe and the discharge pipe are connected on a downstream side of the filter, and the cleaning fluid supplying apparatus is able to perform a supply of the cleaning fluid filtered by the filter to the cleaning apparatus and/or a discharge of the cleaning fluid filtered by the filter to the outside of the system by opening and closing each of the valves of the supply pipe and the discharge pipe.

With this cleaning fluid supplying apparatus, it is possible not only to supply the cleaning fluid filtered by the filter to the cleaning apparatus, but also to discharge the cleaning fluid filtered by the filter to the outside of the system. Therefore, even when a fine bubble is generated in the filtered and built-up cleaning fluid, for example, it is possible to discharge the cleaning fluid containing the fine bubble to the outside of the system, and prevent the cleaning fluid containing the fine bubble from being conveyed to the cleaning apparatus. This makes it possible to inhibit the generation of a minute foreign matter defect in the substrate significantly, and thereby improve productivity and yields.

At this time, it is preferable that, at the connections of the supply pipe and the discharge pipe, a height position of an inlet of the discharge pipe is above a height position of an inlet of the supply pipe.

With such a cleaning fluid supplying apparatus, a fine bubble generated in the filtered cleaning fluid is easily guided to the discharge pipe, making it possible to prevent the cleaning fluid containing the bubble from being supplied to the cleaning apparatus more effectively.

Moreover, the cleaning fluid supplying apparatus including: a filter housing having the filter; and a housing surrounding the filter housing, wherein the cleaning fluid flows from the housing into the filter housing through the filter, and, to the housing, at least a bubble removal pipe for removing a bubble in the cleaning fluid to the outside of the system be connected, is preferable.

With this cleaning fluid supplying apparatus, it is possible to remove a bubble in the cleaning fluid in the housing surrounding the filter housing to the outside of the system. Therefore, the amount of bubbles in the cleaning fluid which is filtered by the filter and to be supplied to the cleaning apparatus can be further reduced. Moreover, it is possible to prevent a decline in filtration ability and particle generation caused by the bubble.

In addition, it is possible that the substrate to be cleaned is any one of a transparent substrate for a photomask, a photomask blank, a photomask blank production intermediate, and a photomask.

When the substrate to be cleaned is any one of those described above, which are required to be subjected to extremely precise cleaning, in response to market demands, it is possible to provide a transparent substrate for a photomask, a photomask blank, a photomask blank production intermediate, and a photomask which are cleaned and provide less generation of foreign matter than conventional ones.

Moreover, when the cleaning fluid is ultrapure water, it is possible to inhibit the generation of fine foreign matter exceedingly, the fine foreign matter which tends to be generated, in particular, at the time of cleaning with ultrapure water.

With the photomask-related substrate cleaning method of the invention, a sulfate ion which is due to sulfur dioxide or the like in the atmosphere or is attached to the surface of a photomask-related substrate treated with sulfuric acid or the like and is difficult to remove therefrom can be removed efficiently in a simple and easy way. Furthermore, it is possible to inhibit the generation of a particle which would be generated after drying the substrate when cleaning with heated pure water is performed.

Moreover, with the cleaning method of the invention, the generation of minute foreign matter resulting from a bubble in the filtered cleaning fluid can be inhibited extremely strongly. This makes it possible to obtain a substrate which is less contaminated by a particle after cleaning, and thereby improve productivity and yields.

Furthermore, with the cleaning fluid supplying apparatus of the invention, it is possible not only to supply the filtered cleaning fluid to the cleaning apparatus, but also to discharge the filtered cleaning fluid to the outside of the system, making it possible to prevent the cleaning fluid containing a fine bubble from being supplied to the cleaning apparatus. As a result, it is possible to inhibit the generation of minute foreign matter in cleaning a substrate and perform precise cleaning.

DETAILED DESCRIPTION OF THE PREFERRED EMBODIMENTS

Figure 1:
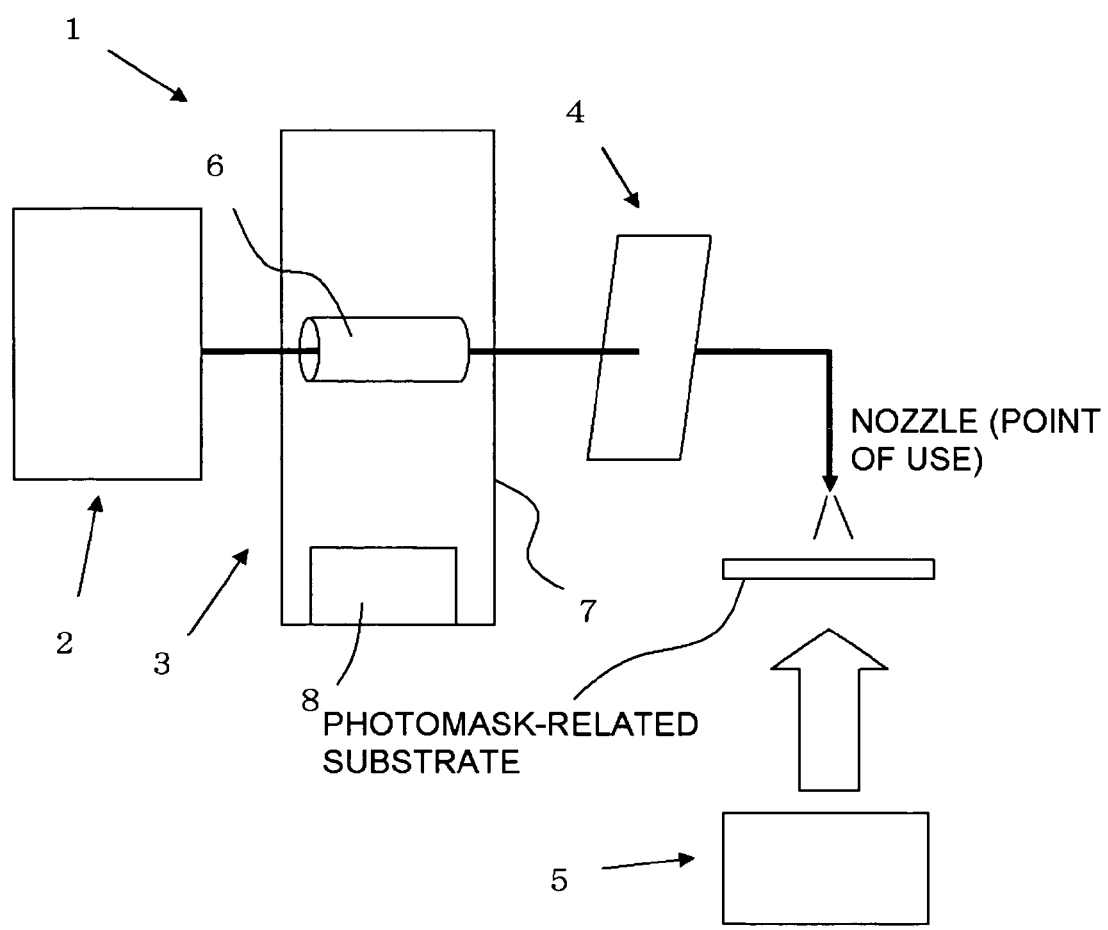
FIG. 1 is a schematic diagram showing an outline of an example of a cleaning system that can carry out a photomask-related substrate cleaning method of the invention.

Hereinafter, embodiments of the invention will be explained; however, the invention is not limited thereto.

First, a photomask-related substrate cleaning method of the invention for contamination by a sulfate ion, in particular, will be described.

When a photomask is irradiated with ArF excimer laser light, if the photomask is contaminated by a sulfate ion, an ammonium sulfate microcrystal is formed and becomes a defect. Although the origin of the sulfate ion is not necessarily specified, it is preferable that the amount of sulfate ions on the surface of the photomask is reduced, and it is preferable that a production intermediate is cleaned to a state in which contamination by a sulfate ion is minimized to prevent the production intermediate from becoming the source of a sulfate ion.

On the other hand, through an intensive study of the sulfate ion, the inventor has found out that, even in a clean room in which acid gas contained in an atmosphere is controlled, when a quartz substrate is stored in that clean room, the amount of sulfate ions does not increase when a quartz substrate is stored in that clean room, however, when, in particular, a photomask-related substrate having a chromium-based material film or a metal silicide-based film formed thereon is stored in that clean room, a sulfate ion is observed on the surface of the photomask-related substrate with time, even when the photomask-related substrate has been cleaned.

Therefore, to obtain a photomask which is less contaminated by a sulfate ion, it is preferable to perform a cleaning operation for removing the sulfate ion in each stage of the production process, including a production intermediate of a photomask blank.

It is common knowledge that the sulfate ion is difficult to remove once it is attached to something. For example, Japanese Unexamined Patent Publication (Kokai) No. 2004-53817 discloses that cleaning using heated pure water is effective. However, according to the research conducted by the inventor, when cleaning water is heated, there is a possibility that contamination by a particle is caused by a cause other than a sulfate ion.

On the other hand, treating the surface of the photomask-related substrate with sulfuric acid or a material containing sulfate is effective in removing foreign matter, such as an organic substance, attached to the surface of the photomask-related substrate easily.

Therefore, the inventor considers, as an example of the origin of the sulfate ion attached to the substrate surface, sulfur dioxide in the atmosphere or a residue remaining after removing foreign matter such as an organic substance by treating the substrate surface with sulfuric acid or a material containing sulfate, and focuses attention on, in particular, cleaning using pure water after the treatment with sulfuric acid or the like.

As a result of an extensive attempt having been made by trial and error in a heated pure water supplying process, the inventor has found out that, by incorporating a deaerating process of removing dissolved gas in pure water by deaeration into a process of supplying pure water to a cleaning apparatus, it is possible to remove a sulfate ion efficiently and inhibit the generation of the particle even when cleaning is performed by using heated pure water, and has completed the present invention.

Conventionally, as is known by Japanese Unexamined Patent Publication (Kokai) No. 11-302689 etc., gas has been rather added to pure water to strengthen cleaning power. Thus, the above research result was an unexpected result.

Hereinafter, a photomask-related substrate cleaning method of the invention will be explained in detail with reference to the drawings; however, the invention is not limited thereto.

First, a cleaning system using pure water, the cleaning system that can be used when the photomask-related substrate cleaning method of the invention is carried out, will be explained.

In FIG. 1, an outline of an example of the cleaning system is shown. Incidentally, a surface treatment apparatus for performing surface treatment and cleaning of the photomask-related substrate with sulfuric acid or a material containing sulfate is also shown.

It is to be noted that the photomask-related substrate is selected from a substrate for a photomask, a photomask blank, a photomask, and a production intermediate thereof.

More specifically, examples include a substrate for a photomask, the substrate which is used for producing a photomask, is made of quartz, calcium fluoride, or the like, and is transparent with respect to exposure light, and a substrate fabricated therefrom.

Moreover, examples include a photomask blank having a metal compound-based material film formed on a transparent substrate, the film of a metal compound-based material such as a transition metal compound, in particular, a metal oxide, a metal oxynitride, a metal oxycarbide, a metal nitride, a metal nitride carbide, a metal carbide, or a metal oxynitride carbide of chromium, titanium, tungsten, tantalum, niobium, or the like, or a production intermediate thereof.

In addition, likewise, examples include a photomask blank having a transition metal silicon compound material film formed on a transparent substrate, the film of a transition metal silicon compound material such as a compound containing transition metal and silicon, in particular, silicon oxide, silicon oxynitride, silicon oxycarbide, silicon nitride, silicon nitride carbide, or silicon oxynitride carbide containing molybdenum, zirconium, tantalum, or titanium, or a production intermediate thereof.

Furthermore, likewise, examples include a photomask blank having a silicon compound film formed on a transparent substrate, the film of a silicon compound such as silicon oxide, silicon oxynitride, silicon oxycarbide, silicon nitride, silicon nitride carbide, or silicon oxynitride carbide, or a production intermediate thereof.

Moreover, the cleaning method of the invention can be suitably applied to cleaning of a photomask obtained by forming a pattern on the above-described photomask blank by typically using an electron beam resist, and transferring the pattern by dry etching or wet etching by using the resist pattern as an etching mask, or a production intermediate thereof.

The cleaning method of the invention can be usefully applied to any target photomask such as a binary mask, a halftone phase-shift mask, or a Levenson mask as long as it has a pattern formed of the above-mentioned film material and the like.

As shown in FIG. 1, the cleaning system 1 mainly has pure water production equipment 2 for producing pure water used to clean a photomask-related substrate, a deaerator 3 for removing dissolved gas in the produced pure water by deaeration, a filter 4 for removing fine foreign matter in the pure water, and a nozzle (point of use) for spraying the pure water on the photomask-related substrate.

Incidentally, in FIG. 1, the pure water is passed through the deaerator 3, and is then supplied to the point of use via the filter 4. However, it is also possible to place the deaerator 3 and the filter 4 in reverse order.

Here, the pure water production equipment 2 is not particularly limited. For example, common pure water production equipment used to clean a photomask-related substrate can be used. Typically, the pure water production equipment 2 can be provided with ion exchange equipment, reverse osmosis equipment, UV irradiation equipment, and defoaming equipment. With this pure water production equipment 2, it is possible to produce so-called ultrapure water.

Moreover, the deaerator 3 is also not particularly limited, and any deaerator may be used basically as long as it is a deaerator that can perform deaeration and keep the cleanliness of the pure water. However, a deaerator which can be easily incorporated into a pure water supply line shown in FIG. 1 and perform deaeration continuously is preferable.

For example, with a vacuum deaerator by which deaeration is performed by passing the pure water directly through a reduced-pressure atmosphere, it is possible to reduce dissolved oxygen to about 0.5 ppm by deaeration. Moreover, with a deaerator that passes the pure water while directing ultrasonic waves thereto with the pressure inside a tank reduced, it is possible to perform deaeration more efficiently.

Furthermore, deaerators that can perform deaeration most efficiently include a deaerator provided with a gas-liquid separation film. As an outline of the deaerator using the gas-liquid separation film, examples thereof include a deaerator which is shown in FIG. 1, for example, and is provided with a hollow fiber membrane 6 which is a gas-liquid separation film, a tank 7 surrounding the hollow fiber, and a vacuum pump 8 for reducing the pressure inside the tank. With this apparatus, it is possible to reduce the pressure of an atmosphere inside the tank 7 by the vacuum pump 8 and remove dissolved gas in the pure water by deaeration by passing the pure water through the hollow fiber membrane 6.

A module using a hollow fiber is commercially available, and, as a material of the gas-liquid separation film, polyolefin, fluorinated polyolefin, silicone, or the like, is used. An appropriate material can be selected on a case-by-case basis according to conditions.

With an apparatus using such a gas-liquid separation film, it is possible to reduce the dissolved oxygen concentration, for example, to 0.1 ppm or lower.

The filter 4 may be any filter as long as it can remove fine foreign matter in the pure water, and is not particularly limited. For example, a commercially available filter can be used. It is possible to select an appropriate filter that is less likely to generate a particle or the like.

As described above, the cleaning system 1 supplies pure water to a photomask-related substrate which is a substrate to be cleaned from the point of use through each of the above-described apparatuses. However, the apparatuses are not limited to those described above, and an appropriate apparatus can be added when necessary. For example, a gas-liquid separator, an intermittent valve, or the like, can be placed to remove a fine bubble generated in the pure water during passage through the cleaning system 1 to the outside of the system.

Incidentally, a photomask-related substrate to be cleaned by this cleaning system 1 is, for example, a substrate whose surface is contaminated by a sulfate ion due to sulfur dioxide in the atmosphere, or a substrate whose surface has been treated with sulfuric acid or the like in advance by a surface treatment apparatus 5 shown in FIG. 1. The surface treatment apparatus 5 is not particularly limited, and any apparatus may be used as long as it can perform surface treatment using sulfuric acid or a material containing sulfate, the surface treatment usually performed for the photomask-related substrate.

Figure 2:
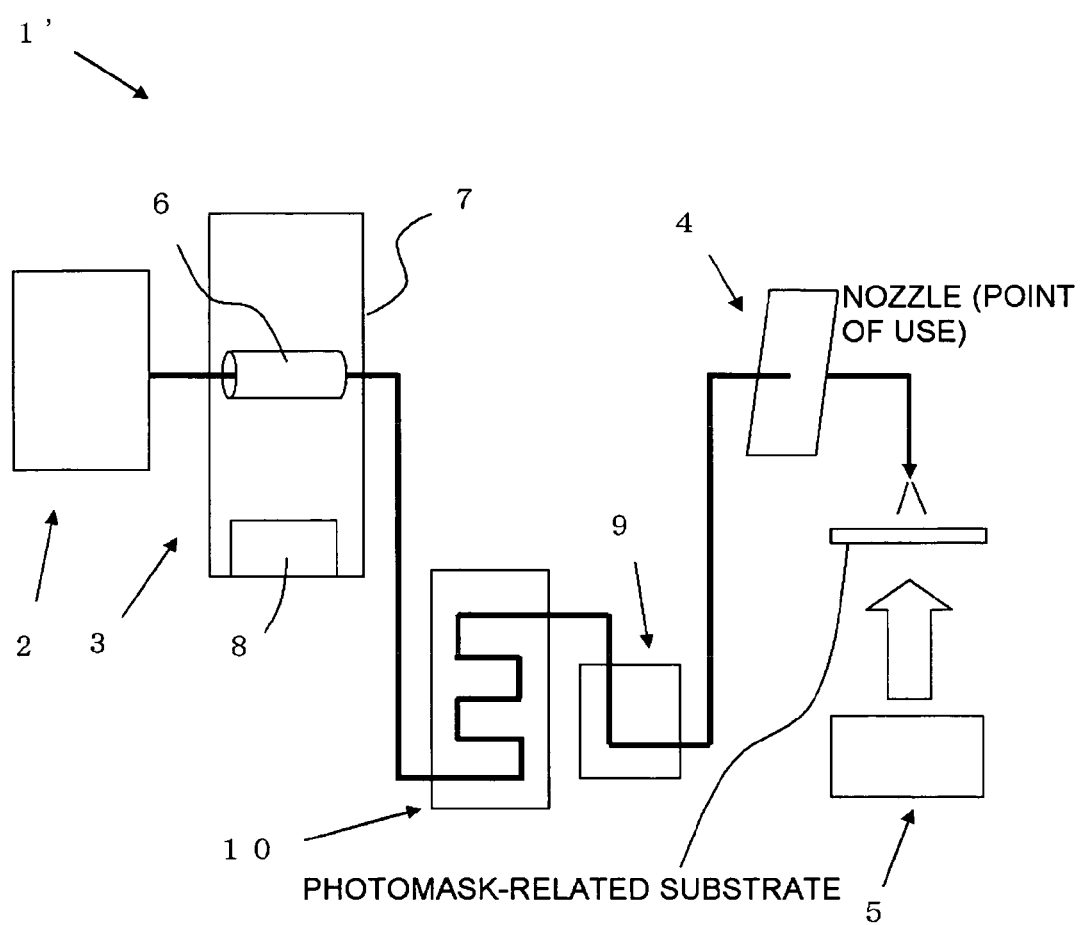
FIG. 2 is a schematic diagram showing an outline of another example of the cleaning system that can carry out the photomask-related substrate cleaning method of the invention.

Moreover, a cleaning system 1' shown in FIG. 2 can be used. This cleaning system 1' mainly has pure water production equipment 2 for producing pure water used to clean a photomask-related substrate, a deaerator 3 for removing dissolved gas in the produced pure water by deaeration, a heating unit (a line heater 9 and a heater 10) for heating the pure water, a filter 4 for removing fine foreign matter in the pure water, and a nozzle (point of use) for spraying the pure water on the photomask-related substrate.

Incidentally, in FIG. 2, the line heater 9 and the heater 10 that is different from the line heater 9 are placed as the heating unit; it is also possible to place an additional heater in addition to them, or place only the line heater 9. All that is needed is to heat the pure water used for cleaning to a predetermined preset temperature, and the number of units for heating the pure water, or the like, is not particularly limited.

Furthermore, in FIG. 2, the pure water is passed through the deaerator 3, is heated by the heater 10 and the line heater 9, is passed through the filter 4, and is then supplied to the point of use. However, the placement of the deaerator 3, the line heater 9, the heater 10, and the filter 4 can be changed as appropriate.

As the heating unit for heating the pure water, in addition to placing the line heater 9 as shown in FIG. 2, it is possible to place the heater 10.

A heating method is not particularly limited, and any method that is less likely to produce foreign matter or the like and can appropriately heat the pure water to a preset temperature can be adopted. For example, the methods include a method using resistance heating and a method using a heat exchanger.

Moreover, by controlling these heating units by a computer or the like, it is possible to heat the pure water to a preset temperature easily and more reliably.

Incidentally, other configurations may be the same as those of the cleaning system 1 of FIG. 1, for example.

Next, the photomask-related substrate cleaning method of the invention will be explained.

Here, a cleaning method using the cleaning system 1 shown in FIG. 1 is first explained; however, the invention is not limited thereto.

At least, a photomask-related substrate which is a substrate to be cleaned is contaminated by a sulfate ion, and it is necessary simply to perform cleaning by using pure water from which dissolved gas is removed by deaeration by performing a deaerating process.

As an example, it is possible to clean a substrate with deaerated water, the substrate contaminated by a sulfate ion due to a residue or the like left as a result of the surface of a photomask-related substrate having been treated with sulfuric acid or a material containing sulfate, and add additional treatment if necessary. For example, it is also possible to perform treatment with sulfuric acid or the like, perform cleaning or the like by simply using pure water as in a conventional method, and then further perform cleaning by using deaerated pure water.

Hereinafter, a case in which, cleaning is performed by using deaerated water after performing treatment with sulfuric acid or the like as described above will be explained. However, in addition to this, the methods of the invention include a method by which, for example, a photomask-related substrate whose surface is contaminated by a sulfate ion due to sulfur dioxide in the atmosphere is cleaned with deaerated water.

First, a photomask-related substrate which is a substrate to be cleaned is prepared.

This photomask-related substrate is any one of the above-described photomask-related substrates, and is subjected to surface treatment by the surface treatment apparatus 5 by using sulfuric acid or a material containing sulfate. In this way, by performing surface treatment by using sulfuric acid or the like, it is possible, for example, to strip off a resist film or remove the organic substance or the like attached to the surface efficiently.

Then, after the above-described surface treatment is performed, the photomask-related substrate is transported to the cleaning system 1, and finish cleaning is performed thereon by using pure water prepared as a cleaning fluid by a method which will be described later.

Hereinafter, cleaning using the cleaning system 1 will be described.

First, by using the pure water production equipment 2, so-called ultrapure water is prepared by performing ion exchange or the like.

Then, the pure water thus produced is conveyed to the deaerator 3, and dissolved gas in the pure water is removed by deaeration (a deaerating process). The method for removing dissolved gas by deaeration is not particularly limited; however; performing deaeration by using a gas-liquid separation film is particularly preferable.

The pure water is passed through the hollow fiber membrane 6 which is a gas-liquid separation film, and is passed along the film. At this time, by reducing the pressure of an atmosphere inside the tank 7 by the vacuum pump 8, it is possible to remove dissolved gas from the pure water passing through the hollow fiber membrane 6 by deaeration.

By removing dissolved gas by deaeration by using the gas-liquid separation film as described above, it is possible, for example, to reduce the dissolved oxygen concentration, which is about 8 ppm in a normal state, to 1 ppm or lower by reducing the pressure by using a water-jet pump as the vacuum pump 8, and to achieve a further reduction in pressure by using a high-powered pump such as an oil pump, making it possible to reduce the dissolved oxygen concentration to 0.1 ppm or lower. In addition to that, it is possible to deaerate a large volume of pure water efficiently with the pure water being hard to suffer contamination by a particle or the like.

When a deaeration state is controlled, in particular, by the dissolved oxygen concentration, by reducing the level to 0.1 ppm or lower, it is possible to remove a sulfate ion significantly.

Moreover, in addition to the above-described deaeration method using the gas-liquid separation film, it is possible to deaerate the pure water by passing the pure water through a tank in which the pressure of an atmosphere is reduced, or passing the pure water through a tank in which the pressure is reduced while directing ultrasonic waves thereto.

Furthermore, it is also possible to combine these deaeration methods.

Next, fine foreign matter contained in the deaerated pure water is removed by using the filter 4 (a foreign matter removing process). This makes it possible to inhibit the generation of a particle resulting from the fine foreign matter. It is possible to perform the conventional foreign matter removing method using the filter 4.

Incidentally, as shown in FIG. 1, it is preferable to perform the filtering process for removing the foreign matter after the deaerating process. However, the order is not limited to that described above, and these processes may be performed in reverse order.

As described above, by at least supplying the pure water from which dissolved gas has been removed in advance by deaeration to the nozzle and spraying the pure water from the nozzle, the photomask-related substrate subjected to treatment with sulfuric acid or the like in advance is cleaned.

At this time, by pouring flowing pure water directly on the photomask-related substrate, it is possible to perform cleaning by spraying the pure water on the substrate, the pure water which has been deaerated and is being sprayed from the nozzle, in a state in which the pure water is exposed to the air or other gases for only a short time. That is, after deaeration it is possible to clean the substrate with the deaerated pure water containing a small amount of dissolved gas. Therefore, the effectiveness of removal of a sulfate ion, the effectiveness obtained by deaeration, can be further enhanced.

When the photomask-related substrate is cleaned by pouring flowing pure water thereon, the cleaning is performed by pouring the flowing pure water preferably for about 30 seconds to 20 minutes, more preferably, for 2 minutes to 20 minutes.

Incidentally, it goes without saying that the cleaning method is not limited to the method by which flowing pure water is poured directly from the nozzle. For example, the photomask-related substrate may be cleaned by spraying the pure water into the tank and immersing the substrate in the stored pure water.

According to the cleaning method of the invention described above, the sulfate ion attached to the surface of the photomask-related substrate subjected to the surface treatment with sulfuric acid or the like can be removed efficiently. In addition, the sulfate ion can be removed with extreme ease because all that is needed is to perform the deaerating process in advance on the pure water serving as a cleaning fluid.

This makes it possible to inhibit the generation of a particle such as ammonium sulfate due to a sulfate ion which is present on the surface, and provide a high-quality photomask-related substrate.

Next, a cleaning method using the cleaning system 1' shown in FIG. 2 will be explained. This cleaning method can be performed in the same manner as in a case in which the cleaning system 1 of FIG. 1 is used, except that a heating process, which will be described later, is added.

It is necessary simply that, at least, a photomask-related substrate which is a substrate to be cleaned is contaminated by a sulfate ion and cleaning by using deaerated and heated pure water is performed.

Examples include cleaning a substrate with the above-described pure water, the substrate contaminated by a sulfate ion due to a residue or the like left as a result of the surface of a photomask-related substrate having been treated with sulfuric acid or a material containing sulfate. It is possible to add additional treatment if necessary. For example, it is possible to perform treatment with sulfuric acid or the like, perform cleaning or the like by simply using pure water as in a conventional method, and perform additional cleaning by using deaerated and heated pure water.

Hereinafter, a case in which, as described above, cleaning is performed by using pure water subjected to a deaerating process and a heating process after performing treatment with sulfuric acid or the like will be explained. However, in addition to this, the methods of the invention include a method by which, for example, a photomask-related substrate whose surface is contaminated by a sulfate ion due to sulfur dioxide in the atmosphere is cleaned by using the above-described pure water.

As described above, since the method is the same as that using the cleaning system 1 of FIG. 1 except that the heating process is added, only the heating process is explained.

The deaerated pure water is conveyed to the heating unit, and is heated to a preset temperature (a heating process). A method for heating the pure water is not particularly limited. For example, heat water can be obtained continuously by heating pure water by the line heater 9. Moreover, by heating the pure water to around a preset temperature in advance by the heater 10 and then heating the pure water again by the line heater 9 in a position near the point of use, it becomes easier to adjust the temperature of the pure water actually supplied from the point of use to the photomask-related substrate to a preset temperature. The number of heating processes or the like can be appropriately determined in consideration of costs, etc.

Although the temperature to which the pure water used for cleaning is heated is not particularly limited, it is preferable to heat the pure water to 55° C. or higher to remove a sulfate ion efficiently. To remove a sulfate ion more efficiently, it is preferable to heat the pure water to 80° C. or higher. In particular, it is preferable that the pure water is heated to 90° C. or higher and is used for cleaning.

In conventional cleaning by simply using heated water, the number of particles generated after cleaning of the substrate tends to increase markedly at 55° C. or higher, becomes particularly problematic at 80° C. or higher, and becomes serious at 90° C. or higher.

However, in the invention, even when such relatively high-temperature pure water is used as a cleaning fluid, since it is the pure water from which dissolved gas has been removed in advance by deaeration by the deaerator 3, unlike the conventional method using the pure water which has been simply heated, it is possible to inhibit the generation of a particle.

Incidentally, as shown in FIG. 2, basically, it is preferable that the deaerating process, the heating process, and the foreign matter removing process are performed in this order. However, the order is not limited thereto, and the deaerating process, the heating process, and the foreign matter removing process can be performed in a different order as appropriate. When the heating process is first performed and then the deaerating process and the foreign matter removing process are performed, however, it is preferable to use a material that ensures that no foreign matter is eluted at high temperature for an apparatus used in the deaerating process and the foreign matter removing process.

In this way, at least, by supplying the pure water which has been deaerated and heated in advance to the nozzle and spraying the pure water from the nozzle, the photomask-related substrate subjected to treatment with sulfuric acid or the like is cleaned.

At this time, by pouring flowing pure water directly on the photomask-related substrate, it is possible to perform cleaning by spraying the pure water on the substrate, the pure water which has been deaerated and is being sprayed from the nozzle, in a state in which the pure water is exposed to the air or other gases for only a short time. That is, it is possible to clean the substrate with the deaerated pure water containing a small amount of dissolved gas. Therefore, the effectiveness of removal of a sulfate ion, the effectiveness obtained by deaeration, can be further enhanced.

Moreover, since a particle is likely to be generated on the substrate when, in particular, flowing heated water is poured on the substrate to clean it, when cleaning is performed by pouring flowing water, the cleaning method of the invention, the method using the deaerated and heated pure water, is particularly effective, and can prevent a particle effectively.

When the photomask-related substrate is cleaned by pouring flowing pure water thereon, the cleaning is performed by pouring the flowing pure water preferably for about 30 seconds to 20 minutes, more preferably, for 2 minutes to 20 minutes.

Incidentally, it goes without saying that the cleaning method is not limited to the method by which flowing pure water is poured directly from the nozzle. For example, the photomask-related substrate may be cleaned by spraying the pure water into the tank and immersing the substrate in the stored pure water.

According to the cleaning method of the invention described above, the sulfate ion attached to the surface of the photomask-related substrate can be removed efficiently. In addition, the sulfate ion can be removed with extreme ease because all that is needed is to perform the deaerating process and the heating process in advance on the pure water serving as a cleaning fluid.

This makes it possible to inhibit the generation of a particle such as ammonium sulfate due to a sulfate ion which is present on the surface. At the same time, it is possible to inhibit the generation of a particle which would be generated by a cause other than a sulfate ion after drying the substrate cleaned by heated water.

Therefore, it becomes possible to provide a high-quality photomask-related substrate.

Next, a cleaning method and a cleaning fluid supplying apparatus of the invention for, in particular, a fine bubble in a built-up cleaning fluid after filtration will be described.

Currently, foreign matter contamination by even an extremely fine particle is expected to be prevented in cleaning of a transparent substrate for a photomask, a photomask blank, a photomask blank production intermediate, a photomask, or the like, concerning lithography process on a product, such as a semiconductor, in particular, having an extremely fine pattern shape. Thus, various proposals have been made, including improvement of a cleaning fluid, which has been described as a conventional technology, or improvement of a drying method.

However, although each of the above methods has some effects, a problem related to fine foreign matter has arisen unexpectedly.

Moreover, the inventor has also found out that, by checking the cleaned substrate for a defect caused by extremely fine foreign matter having a size of the order of 0.08 μm, a problem related to fine foreign matter arises at significant frequency unexpectedly even when cleaning is performed with the utmost care and attention.

When a defect due to such fine foreign matter is generated on a transparent substrate or in a formed intermediate film, it may cause exfoliation of a layered film or an abnormal behavior at the time of etching. Moreover, when a defect is generated on a mask blank, it may cause an abnormal behavior at the time of etching, exfoliation of a resist film, or an abnormal shape of a resist pattern. Therefore, to produce a photomask having a fine pattern with a high degree of reliability, it is necessary to solve such a problem related to fine foreign matter.

Thus, to solve this problem, the inventor conducted an intensive research on fine foreign matter on a cleaned substrate. Specifically, the inventor studied the cause of the problem and a method to solve the problem by checking how a contamination generation status was changed by making various hypotheses about the cause of the generation of foreign matter and performing operation that eliminates the cause.

In general, to prevent fine foreign matter from being mixed into a cleaning fluid, a cleaning fluid supplying apparatus is provided upstream of the cleaning apparatus, and a cleaning fluid is filtered by using a filter immediately before it is used. Moreover, control of conveying of a cleaning fluid performed around the filter has been performed in a system in which an opening and closing mechanism is disposed on the upstream side of the filter in case a particle is generated from an opening and closing control mechanism such as a valve so that a particle, if any, generated from the control mechanism can be removed by the filter.

However, after further study of such an apparatus, the inventor considered that, when this conventional apparatus was used, a bubble was likely to be generated from a cleaning fluid building up in the cleaning fluid supplying apparatus, in particular, the cleaning fluid building up in relatively large amounts in a space in a filter housing, the space located on the downstream side of a filter, during interruption of conveying of the fluid to the cleaning apparatus, and the generated bubble was sent to the point of use without being removed along the way. This bubble is attached to a substrate to be cleaned during cleaning, which may cause fine foreign matter.

Thus, the inventor hypothesized that, as described above, a fine bubble generated in the filter housing of the cleaning fluid supplying apparatus, the filter housing having a filter, during cleaning, in particular, while the supply of a cleaning fluid was stopped and mixed into the cleaning fluid actually supplied to the point of use was responsible for the generation of foreign matter, and tried to remove such a bubble or the cleaning fluid containing such a bubble from the cleaning fluid to be supplied to the point of use. As a result, the inventor has found out that doing so helps strongly inhibit the occurrence of contamination by the above-described unexpected fine foreign matter.

That is, the inventor has found out that a bubble is responsible for the generation of foreign matter and the above-described foreign matter-related problem can be solved by preventing a fine bubble generated from a built-up cleaning fluid after filtration, in particular, from flowing into a cleaning fluid to be supplied to the cleaning apparatus, and has completed the invention.

Hereinafter, the cleaning fluid supplying apparatus and the cleaning method of the invention will be explained in detail with reference to the drawings; however, the invention is not limited thereto.

First, the cleaning fluid supplying apparatus of the invention will be described.

First Embodiment

Figure 3:
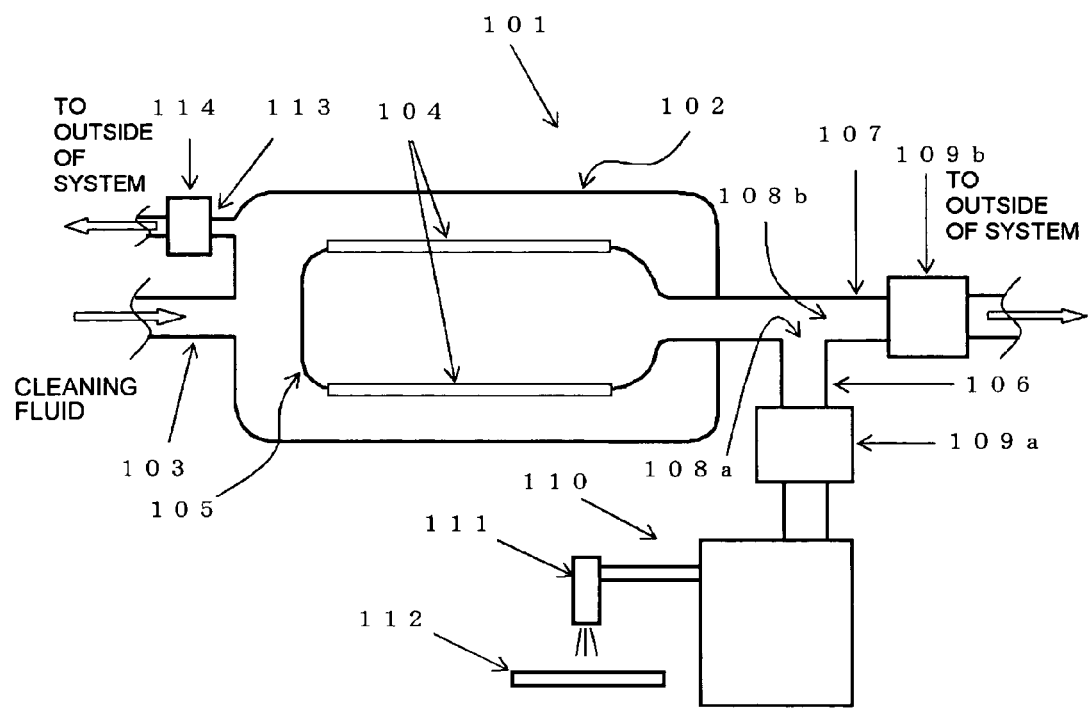
FIG. 3 is a schematic diagram showing an outline of an example of a cleaning apparatus and an example of a cleaning fluid supplying apparatus of the invention.

In FIG. 3, an outline of an example of the cleaning fluid supplying apparatus of the invention is shown. Incidentally, a cleaning apparatus 110 disposed downstream of a cleaning fluid supplying apparatus 101 and a substrate 112 to be cleaned by a cleaning fluid sprayed from a nozzle 111 (point of use) of the cleaning apparatus are also shown.

Incidentally, the substrate 112 to be cleaned may be, for example, a transparent substrate for a photomask, a photomask blank, a photomask blank production intermediate, and a photomask which require precise cleaning. It goes without saying that the cleaning fluid supplying apparatus of the invention can be applied to cleaning of objects other than those described above.

Moreover, when the cleaning fluid is, for example, ultrapure water, the equipment for producing ultrapure water is usually provided with an apparatus for removing gas which may be generated during a process such as UV sterilization to the outside of the system, and such deaerated pure water can also be used. Cleaning fluids that can produce an especially useful effect of the invention are common cleaning fluids used in cleaning operation in which a process using a scrub is not performed after applying a cleaning fluid to a substrate to be cleaned, and specifically include ultrapure water, ultrapure water whose conductivity is adjusted by gas introduction, hydrogen water, ozone water, and a diluted hydrofluoric acid solution.

As shown in FIG. 3, the cleaning fluid supplying apparatus 101 has a housing 102, and the housing 102 is provided with a cleaning fluid inlet 103 through which a cleaning fluid conveyed after having been subjected to the heating process, for example, enters the housing 102. Moreover, inside the housing 102, a filter housing 105 having a filter 104 is provided, and the cleaning fluid that has entered the housing 102 is filtered by the filter 104 and flows into the filter housing 105.

Furthermore, a supply pipe 106 for supplying the filtered cleaning fluid to the cleaning apparatus 110 and a discharge pipe 107 for discharging the cleaning fluid filtered by the filter to the outside of the system are disposed on the downstream side of the filter 104. In a case shown in FIG. 3, one pipe connected to the filter housing 105 is branched and is connected to the supply pipe 106 and the discharge pipe 107 described above.

In this case, a branch may take any shape in accordance with the apparatus. To make it easier to discharge a bubble in the cleaning fluid to the outside of the system by guiding it to the discharge pipe 107, a pipe located on the upper side relative to a direction of gravity at a branching part is used as the discharge pipe 107. That is, it is preferable that connection may be made in such a way that a height position of an inlet 108b of the discharge pipe 107 is above a height position of an inlet 108a of the supply pipe 106.

Typically, the branch is T-shaped, and a pipe leading out of the filter housing 105 is placed in line with the discharge pipe 107, and the supply pipe 106 is made to project downward.

Incidentally, for the placement of the supply pipe 106 and the discharge pipe 107 described above even when the vertical positions of the supply pipe 106 and the discharge pipe 107 are reversed due to the design of the flow path in the housing 102 or the setting of the amount of discharge from the discharge pipe 107. It is possible to discharge the built-up cleaning fluid almost completely from the mouth 108b of the discharge pipe 107.

Moreover, the supply pipe 106 is provided with a valve 109a, and, by opening and closing the valve 109a, it is possible to control the amount of cleaning fluid to be supplied to the cleaning apparatus 110. Furthermore, the discharge pipe 107 is provided with a valve 109b, and, by opening and closing the valve 109b, it is possible to control the amount of cleaning fluid to be discharged to the outside of the system.

These valves 109a and 109b are not particularly limited, and various kinds of valves such as an air-driven or electromagnetically-driven on-off valve and a needle valve can be used. These valves simply have to control the amount of cleaning fluid, and a valve that can be automatically controlled by a program or the like is preferable. Furthermore, it is more convenient to use the valves 109a and 109b that are controlled in conjunction with each other. These valves simply have to pass an intended amount of cleaning fluid with intended timing through the supply pipe 106 and the discharge pipe 107. Moreover, the number of valves is also not particularly limited.

In addition, when a branching part of the supply pipe 106 and the discharge pipe 107 (or, in the case of the configurations of FIGS. 4 and 5 which will be described later, a connection of a supply pipe to a filter housing) is too distant from the point of use, there is a possibility that a bubble is generated in the pipe while the supply of the cleaning fluid is stopped, leading to a weakening of the effect of the invention. Therefore, it is preferable that the length of a pipe from the filter 104 to the point of use is short; the length is preferably 5 m or less, and, more preferably, 2 m or less.

Moreover, as shown in FIG. 3, it is possible to connect a bubble removal pipe 113 to the housing 102 if necessary. Although a position in which the bubble removal pipe 113 is connected is not particularly limited, connecting the bubble removal pipe 113 to the upper part of the housing 102 is preferable because doing so makes it possible to remove a bubble more efficiently. In FIG. 3, the bubble removal pipe 113 is connected to a side surface of the housing 102, the side surface on which the cleaning fluid inlet 103 is provided. The bubble removal pipe 113 is provided with, for example, a gas-liquid separator 114 or an intermittent valve, which makes it possible to remove a bubble present in the cleaning fluid in the housing 102 to the outside of the system through the bubble removal pipe 113.

As a result, it is possible to remove a bubble contained in the cleaning fluid in the housing 102. This ultimately makes it possible to prevent the cleaning fluid containing a bubble from being supplied to the cleaning apparatus 110 more effectively. In addition, it is possible to inhibit a decline in filtration ability of the filter 104 and the generation of a particle from the filter 104 caused by a bubble, making it possible to improve the efficiency of cleaning and inhibit more the generation of a particle in the cleaned substrate.

As the gas-liquid separator 114, a variety of gas-liquid separators have become publicly known, and a gas-liquid separator that removes gas by using a gas-liquid separation film through which only a molecule of gas can pass and applying negative pressure to the outside thereof, or a gas-liquid separator that uses a difference in specific gravity between gas and liquid has been known. Any gas-liquid separator can be used as long as it can remove a bubble efficiently.

On the other hand, instead of a gas-liquid separator that removes only a bubble to the outside of the system by separating a bubble from the cleaning fluid completely, a type of a gas-liquid separator that removes the cleaning fluid containing a bubble, with the cleaning fluid and a bubble being integral, can be provided.

For example, in the case of a type of the above-described gas-liquid separator using a difference in specific gravity, it can remove a bubble together with a certain amount of cleaning fluid to the outside of the system, instead of removing only a bubble. This eliminates the need to make large an apparatus for separating a bubble from the cleaning fluid completely, making it possible to make the gas-liquid separator compact.

In the conventional cleaning fluid supplying apparatus, since the discharge pipe 107 of the cleaning fluid supplying apparatus 101 of the invention is not connected on the downstream side of the filter, the filtered cleaning fluid is supplied as it is to the cleaning apparatus and is sprayed on the substrate to be cleaned.

However, in the above-described cleaning fluid supplying apparatus 101 of the invention, since, in addition to the supply pipe 106 supplying the cleaning fluid to the cleaning apparatus 110, the discharge pipe 107 for discharging the cleaning fluid to the outside of the system is connected on the downstream side of the filter, it is possible to discharge the filtered cleaning fluid building up in the filter housing 105 due to the suspension of the cleaning operation, for example, and containing a fine bubble generated therein to the outside of the system through the discharge pipe 107. That is, it is possible to prevent the filtered cleaning fluid containing a fine bubble from being supplied to the cleaning apparatus 110 and sprayed on the substrate 112 to be cleaned.

In conjunction with the control of the valves 109a and 109b, it is possible to supply the filtered cleaning fluid which does not build up in the filter housing 105, and contains few fine bubbles to the cleaning apparatus 110 through the supply pipe 106 and spray the cleaning fluid on the substrate to be cleaned at the time of cleaning thereof.

Therefore, with the cleaning fluid supplying apparatus of the invention, it is possible to inhibit the generation of a minute foreign matter defect which would be found on the substrate after cleaning and clean the substrate with high productivity and high yield.

Second Embodiment

Figure 4:
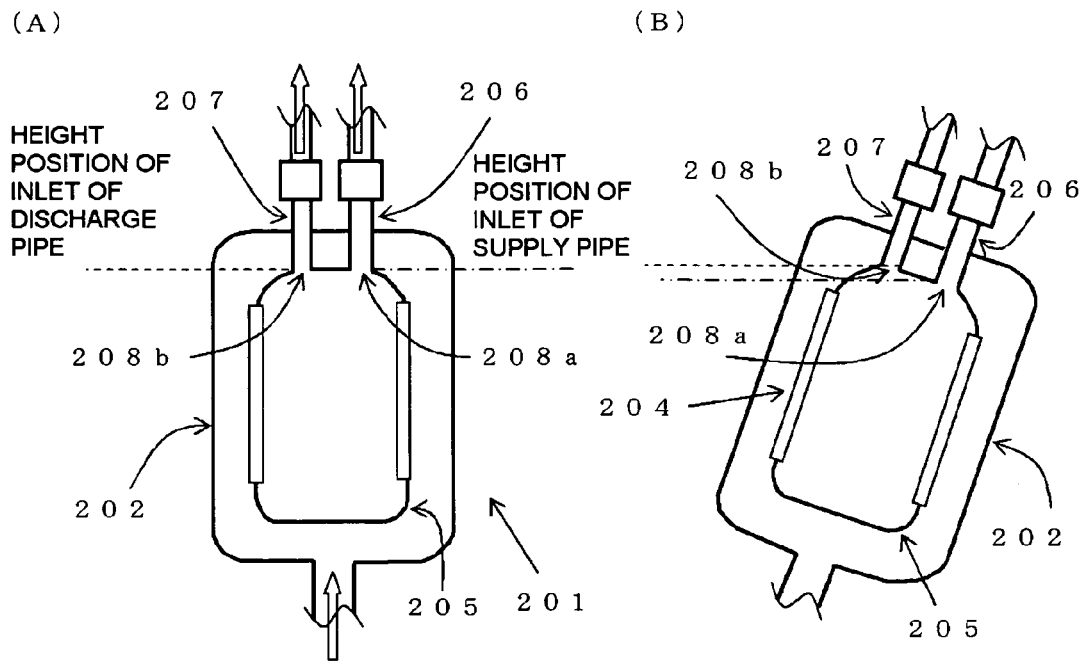
FIG. 4 is a schematic diagram showing an outline of an example of another embodiment of the cleaning fluid supplying apparatus of the invention.

In a case shown in FIG. 4, a cleaning fluid supplying apparatus 201 of the invention in accordance with another embodiment is shown. In FIG. 4, a supply pipe 206 and a discharge pipe 207 are connected directly to the upper surface of a filter housing 205.

At this time, as shown in FIG. 4(A), the supply pipe 206 and the discharge pipe 207 can be connected in such a way that a height position of an inlet 208a of the supply pipe 206 and a height position of an inlet 208b of the discharge pipe 207 are on the same level by horizontally placing a housing 202 and the filter housing 205 of the cleaning fluid supplying apparatus 201, for example.

On the other hand, as shown in FIG. 4(B), the supply pipe 206 and the discharge pipe 207 can also be connected in such a way that the height position of the inlet 208b of the discharge pipe 207 is above the height position of the inlet 208a of the supply pipe 206 by placing the housing 202 and the filter housing 205 of the cleaning fluid supplying apparatus 201 at a tilt, for example. It is more preferable that the connections of the supply pipe 206 and the discharge pipe 207 have such a positional relationship because this makes it easier to discharge a bubble in the filtered cleaning fluid to the outside of the system through the discharge pipe 207 as described above.

Moreover, in FIG. 3, the apparatus having the housing 102 provided with the bubble removal pipe 113 has been explained. However, as shown in FIG. 4, the apparatus having no bubble removal pipe is also possible. In the configuration of FIG. 4, in particular, a bubble in the cleaning fluid in the housing 202 is considered to move to the upper end of the housing 202 easily, and the bubble is considered to be less prone to move from the filter 204 into the filter housing 205 as compared to the configuration of FIG. 3. However, it goes without saying that, even in the configuration of FIG. 4, it is also possible to connect a bubble removal pipe separately to the upper part of the housing 202.

Third Embodiment

Figure 5:
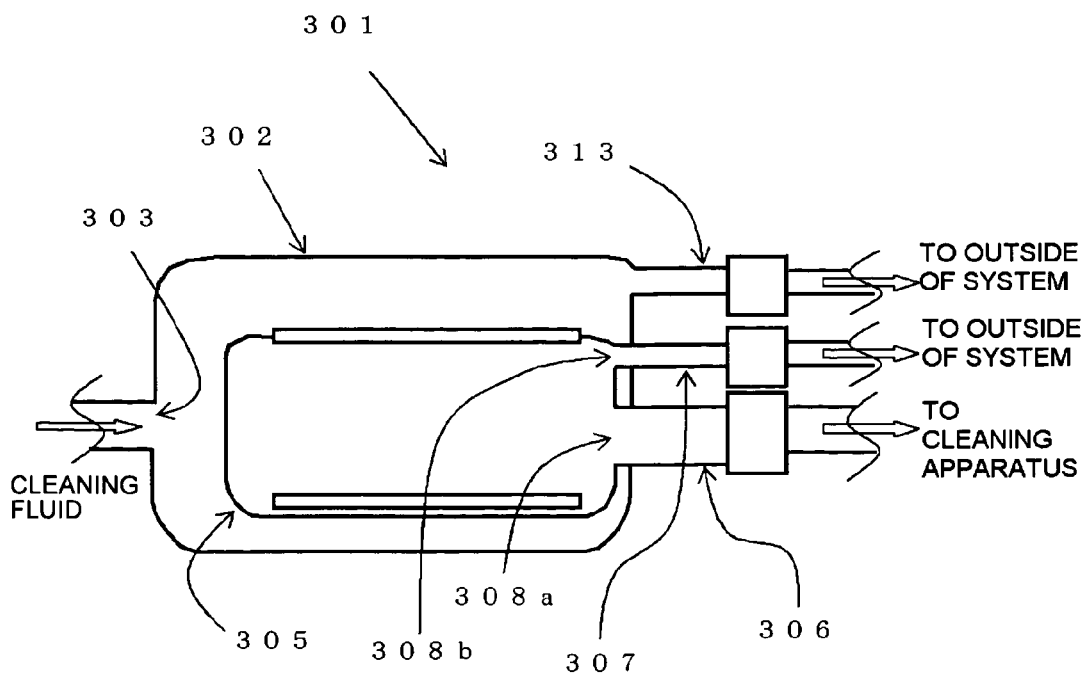
FIG. 5 is a schematic diagram showing an outline of an example of another embodiment of the cleaning fluid supplying apparatus of the invention.

In FIG. 5, a cleaning fluid supplying apparatus 301 of the invention in accordance with still another embodiment is shown.

In a case shown in FIG. 5, a supply pipe 306 and a discharge pipe 307 are connected directly to a side surface of a filter housing 305. Also in this case, it is preferable that the supply pipe 306 and the discharge pipe 307 be connected in such a way that a height position of an inlet 308b of the discharge pipe 307 is above the height position of an inlet 308a of the supply pipe 306.

Moreover, a bubble removal pipe 313 is connected to a side surface of a housing 302, the side surface opposite to the side surface in which a cleaning fluid inlet 303 is provided.

Up to this point, the embodiments of the cleaning fluid supplying apparatus of the invention have been described with examples; however, the cleaning fluid supplying apparatus of the invention is not limited to those embodiments. The cleaning fluid supplying apparatus of the invention simply has to include at least a supply pipe and a discharge pipe, each having a valve, on the downstream side of a filter, and be able to perform a supply of a cleaning fluid filtered by the filter to a cleaning apparatus and/or a discharge thereof to the outside of the system by opening and closing control of the valve.

Moreover, other component elements or the like of the apparatus are not particularly limited, and the same component elements as those used in the conventional product, for example, can be used.

Next, a cleaning method of the invention will be explained.

Here, a cleaning method using the cleaning fluid supplying apparatus 101 of FIG. 3 will be explained; however, the cleaning fluid supplying apparatus used is not limited thereto. In the cleaning method of the invention, it is sufficient that, the filtered cleaning fluid can be discharged to the outside of the system through a discharge pipe at least prior to a supply of the filtered cleaning fluid to a cleaning apparatus and, thereafter, the filtered cleaning fluid can be supplied to the cleaning apparatus through the supply pipe, when removing foreign matter by filtering a cleaning fluid by a filter and supplying the filtered cleaning fluid to the cleaning apparatus through a supply pipe to clean a substrate to be cleaned. And it is sufficient that the cleaning method may be carried out by preparing an appropriate cleaning fluid supplying apparatus.

That is, in the cleaning method of the invention, prior to cleaning of the substrate 112 to be cleaned by supplying the cleaning fluid to the cleaning apparatus 110, the cleaning fluid filtered by the filter 104 is first discharged to the outside of the system from the discharge pipe 107 by opening the valve 109b. As a result, it is possible to discharge the cleaning fluid building up mainly in the filter housing 105 along with a fine bubble generated in the cleaning fluid.

Then, after once discharging the cleaning fluid to the outside of the system as described above and then closing the valve 109b, for example, the cleaning fluid is supplied from the supply pipe 106 by opening the valve 109a to clean the substrate 112 to be cleaned by actually spraying the cleaning fluid from the nozzle 111.

More preferably, in supplying the cleaning fluid to the cleaning apparatus 110, the cleaning fluid is continuously discharged to the outside of the system through the discharge pipe 107 until the filtered cleaning fluid is supplied from the supply pipe 106 by opening the valve 109a. As a result, it is possible to inhibit the generation of a fine bubble while preventing the cleaning fluid from building up in the filter housing 105 or the like, and supply the cleaning fluid in which the generation of a bubble is inhibited to, the cleaning apparatus 110.

This makes it possible to clean the substrate 112 to be cleaned with the cleaning fluid in which a fine bubble is reduced extremely, and prevent a minute defect and foreign matter due to a fine bubble.

Incidentally, in this case, the discharge of the cleaning fluid from the discharge pipe 107 simply has to be performed until the filtered cleaning fluid starts to be supplied to the cleaning apparatus 110 through the supply pipe 106 as described above, and the operation that follows is not particularly limited.

Therefore, for example, even after the cleaning fluid starts to be supplied to the cleaning apparatus 110 through the supply pipe 106 by opening the valve 109a, the cleaning fluid may be continuously discharged from the discharge pipe 107 at the same time. Then, after the cleaning fluid is continuously discharged for a predetermined period of time, the discharge of the cleaning fluid can be stopped by closing the valve 109b. After cleaning of one substrate to be cleaned is completed and the supply of the cleaning fluid to the cleaning apparatus 110 is stopped, when the next substrate to be cleaned is cleaned, the cleaning fluid is discharged from the discharge pipe 107 by opening the valve 109b again prior to the cleaning thereof.

Alternatively, the discharge of the cleaning fluid from the discharge pipe 107 can also be stopped by closing the valve 109b concurrently with the start of the supply of the cleaning fluid to the cleaning apparatus 110 through the supply pipe 106 by opening the valve 109a. That is, this is a method by which the cleaning fluid is discharged only immediately before the start of the supply thereof, whereby only the cleaning fluid building up in the filter housing 105 is discharged. By adopting this method, it is possible to reduce the consumption of the cleaning fluid to a minimum.

In this case, it is necessary to take the time to perform discharge operation immediately before the cleaning fluid starts to be used in the cleaning process, and, to prevent the timing of the supply from being late relative to the timing of the discharge, it is preferable to create a normal cycle of supply at the time of cleaning and operate each valve or the like according to that program. By automatically controlling the opening and closing of the valves 109a and 109b, it is possible to supply and discharge the cleaning fluid with intended timing more reliably. It goes without saying that the valves 109a and 109b can be automatically controlled as just described in other cycles.

When the above-described program is created, it is preferable that the amount of time to perform only discharge, the amount of time between the start of the operation of discharging the built-up cleaning fluid by opening the valve 109b and the start of supply by opening the valve 109a, is set so that adequate discharge is performed in a short period of time by adjusting the amount of discharged fluid according to the size or the like of the filter housing 105, and it is preferable to make an adjustment so that discharge is performed in about 0.2 seconds to 5 seconds.

Such control can be performed by a sequencer, for example. That is, such control can be performed by assembling an apparatus that can perform coordinated operations so that the valve 109b is first opened when a signal indicating the use of a cleaning fluid is inputted, and, after a lapse of a predetermined time for performing adequate discharge, the valve 109a is opened and the valve 109b is closed.

Incidentally, it goes without saying that the valves 109a and 109b or the like can be controlled manually without using a program.

Furthermore, with the aim of cleaning a plurality of substrates to be cleaned, for example, during the time between the start of the supply to the cleaning apparatus 110 for cleaning the first substrate to be cleaned and the completion of the cleaning of the last substrate to be cleaned (that is, from the start to the end of the cleaning process), the built-up cleaning fluid after filtration may be discharged by opening the valve 109b only immediately before the valve 109a is changed from a closed state to an open state as described above. However, to make the generation itself of a bubble unlikely, when the valve 109a is in a closed state, the valve 109b may be always kept open.

Since the cleaning fluid is prevented from building up in the filter housing 105 by this operation, the generation itself of a bubble is made unlikely. Moreover, when this method is adopted, a problem related to supply timing, such as the occurrence of a time lag corresponding to the time to perform discharge when the start of the above-described supply to the cleaning apparatus 110 is desired, does not arise. Therefore, in particular, when the cleaning operation is performed manually, adopting this method makes it possible to perform the cleaning operation by a simple apparatus with a high degree of ease of use.

Moreover, with the aim of cleaning one or more substrates to be cleaned, during the time between the start of the supply to the cleaning apparatus 110 and the completion of the cleaning process (that is, until all substrates to be cleaned are cleaned), the valve 109b may be always in an open state. Adopting this method results in some waste of a cleaning fluid; however, adopting this method eliminates the need to open and close the valve 109b in conjunction with the opening and closing of the valve 109a, making it possible to control the apparatus in a remarkably simple way.

Now, when the valve 109b is kept open even when the valve 109a is in an open state, the amount of cleaning fluid discharged through the discharge pipe 107 is preferably set, as a guide, at $\frac{1}{20}$ to 3 times, more preferably, at $\frac{1}{10}$ to 2 times the amount of cleaning fluid supplied from the supply pipe 106. Since an optimum value of the discharge amount at this time depends on the shape of the housing 102 or the placement of the supply pipe 106 and the discharge pipe 107, it is necessary to make an adjustment according to the actual apparatus. However, in general, it is possible to obtain more effective results with the above-described amount set as a guide. Moreover, since the discharge more than necessary leads not only to a waste of the cleaning fluid but also to an increase in filtration pressure, it may reduce ability to reduce foreign matter at the filter 104 depending on the selection of the filter 104. Thus, it is preferable to avoid discharging the cleaning fluid whose amount is three times or more the supplied amount.

In addition, in supplying the cleaning fluid to the cleaning apparatus 110 and discharging the cleaning fluid to the outside of the system, it is preferable that the height position of the inlet of the discharge pipe is above the height position of the inlet of the supply pipe. For example, as shown in FIG. 3, the above condition can be achieved by using the T-shaped branch as described above.

On the other hand, when an apparatus in which the supply pipe and the discharge pipe are connected directly to the filter housing is used, it is preferable that the apparatus is placed at a tilt as shown in FIG. 4(B) so that the height position of the inlet of the discharge pipe is above the height position of the inlet of the supply pipe relative to a direction of gravity.

Moreover, when it is difficult to place the apparatus as described above, it is preferable to make the orientation of the filter housing adjustable so that the discharge pipe is above the supply pipe when bringing the valve on the discharge pipe side from a closed state to an open state.

In particular, when a method by which the valve on the discharge pipe side is always kept open in the above-described cleaning process is adopted, by performing discharge after adjusting the discharge pipe so as to be above the supply pipe at the start of use, even when the inlet of the supply pipe is above the inlet of the discharge pipe, it is possible to achieve the effect of the invention satisfactorily.

Incidentally, as the cleaning fluid, though not particularly limited, ultrapure water, for example, can be used. When ultrapure water is used, the invention is especially effective. It is possible to determine the type of cleaning fluid appropriately on an as-needed basis.

Moreover, the substrate 112 to be cleaned is not particularly limited. For example, the cleaning method of the invention can be applied to a transparent substrate for a photomask, a photomask blank, a photomask blank production intermediate, and a photomask.

EXAMPLES

Hereinafter, the invention will be explained in more detail by using examples; however, the invention is not limited thereto.

Example 1

The following substrate was prepared as a test substrate.

A prepared substrate was obtained by using a photomask blank which was a quartz substrate measuring 152 mm per side and having a light shielding film formed thereon, the light shielding film being a chromium oxynitride film as an uppermost surface thereof, performing sulfuric acid cleaning thereof, cleaning the substrate by using hydrogen water (pH 10) to which ammonia water was added, and then rinsing the substrate with undeaerated pure water. Then, the substrate thus obtained was put in a resin blank container and stored in a clean room for four months.

Cleaning of the substrate was performed by using the cleaning system 1 of FIG. 1.

A pure water supply line connecting a deaerator and a filter was used between pure water production equipment and a spin cleaning and drying machine provided with a nozzle.

Incidentally, as the deaerator, SEPAREL EF-040P (hollow fiber material: poly(4-methylpentene)) manufactured by DIC Corporation was used.

After the pressure of an atmosphere was reduced by the vacuum pump, the content of oxygen in the pure water obtained from the nozzle of the spin drying machine was 0.01 ppm (which was measured by using DO-32A manufactured by DKK-TOA Corporation) and the temperature thereof was 30° C.

Moreover, the filter used was QuickChange Plus 1500 (pore size: 0.02 μm to 0.05 μm) manufactured by Entegris, Inc.

By using such a cleaning system 1, the cleaning method of the invention was carried out.

Two of the above-described test substrates stored for four months were used, and each of these was placed in the spin cleaning and drying machine and cleaned by pouring a liter of flowing pure water (outlet temperature: 30° C.) on the test substrate per minute for ten minutes. Incidentally, in the deaerator, the pressure was reduced by using the vacuum pump.

Furthermore, the substrate was then subjected to spin drying at 1000 rpm for 30 seconds.

Each of the dried substrates was put in a quartz cell with 100 ml of pure water without delay and immersed under water, and ion extraction was performed at 90° C. for 60 minutes. In addition, the extract thus obtained was subjected to ion chromatography (using DX-500 manufactured by Nippon Dionex K.K.), whereby quantification of sulfate ions in the extract was performed.

The obtained quantitative values are shown in Table 1 along with data on other ions.

TABLE 1

|  | $Cl^-$ | $NO_2^-$ | $NO_3^-$ | $SO_4^{2-}$ | $Na^+$ | $NH_4^+$ | $K^+$ |
|---|---|---|---|---|---|---|---|
| Example 1-1 | 4.3 | 12.5 | 10.2 | 69.4 | N.D. | 51.6 | N.D. |
| Example 1-2 | 4.6 | 12.2 | 11.8 | 67.3 | N.D. | 52.4 | 0.2 |
| Comparative Example 1-1 | 4.8 | 12.9 | 12.8 | 163.1 | N.D. | 56.0 | N.D. |
| Comparative Example 1-2 | 4.6 | 13.2 | 10.6 | 138.2 | N.D. | 56.0 | N.D. |

As shown in Table 1, the results of the two test substrates (Example 1-1 and Example 1-2) revealed that, in terms of a sulfate ion, the quantitative value of Example 1-1 was 69.36 (ng/substrate) and the quantitative value of Example 1-2 was 67.29 (ng/substrate).

Comparative Example 1

Two test substrates were used and treated under the same conditions as the pure water cleaning and drying performed in Example 1 by using the same apparatus, except that the deaerator of the pure water supply line use in Example 1 was not provided, and therefore no deaerating process was performed. That is, as in the conventional method, cleaning of the substrate was performed by using pure water which had not been subjected to deaeration and had been subjected to removal of foreign matter. Moreover, the treated substrates were then subjected to ion extraction under the same conditions as those used in Example 1, and quantification of sulfate ions was performed.

Incidentally, at this time, the content of oxygen in the pure water obtained from the nozzle of the spin drying machine was on the order of 8 ppm.

The obtained quantitative values are shown in Table 1 along with data on other ions.

As shown in Table 1, the results of the two test substrates (Comparative Example 1-1 and Comparative Example 1-2) revealed that, in terms of a sulfate ion, the quantitative value of Comparative Example 1-1 was 163.13 (ng/substrate) and the quantitative value of Comparative Example 1-2 was 138.20 (ng/substrate).

As is clear from Example 1 and Comparative Example 1, it was confirmed that the amount of sulfate ions was greatly reduced in the test substrate cleaned by using deaerated pure water as in the cleaning method of the invention as compared to a case in which the undeaerated pure water was used. Moreover, the results showed that this effect was specific to the sulfate ion.

Example 2

The following substrate was prepared as a test substrate.

A photomask blank production intermediate which was a quartz substrate measuring 152 mm per side and having a silicon oxynitride film containing molybdenum formed thereon so as to be an uppermost surface thereof was prepared. After a common cleaning process (sulfuric acid cleaning and cleaning with hydrogen water (about pH 9) to which ammonia water is added) was performed on this production intermediate, the production intermediate was rinsed with room-temperature water, and was subjected to spin drying at 1000 rpm for two minutes. In this way, the test substrate was prepared.

Next, a surface particle of the obtained substrate was measured by using a defect detection apparatus (MAGICS manufactured by Lasertec Corporation), whereby the defect position on the test substrate was located.

The test substrate prepared as described above was cleaned by using the cleaning system 1' of FIG. 2.

A pure water supply line having pure water production equipment, a deaerator, a heater, a line heater, and a filter was used.

As the deaerator, SEPAREL EF-040P (hollow fiber material: poly(4-methylpentene)) manufactured by DIC Corporation was used, and, after the pressure of an atmosphere was reduced by using the vacuum pump, the content of oxygen in the obtained pure water was 0.9 ppm (which was measured by using DO-32A manufactured by DKK-TOA Corporation).

Moreover, the pure water to be supplied was once heated by the heater to about 80° C., which was a preset temperature, and the temperature of the pure water to be supplied was adjusted to become 80° C. by heating the pure water again by the line heater near the point of use.

Furthermore, the filter used was QuickChange Plus 1500 (pore size: 0.02 μm to 0.05 μm) manufactured by Entegris, Inc.

By using such a cleaning system 1', the cleaning method of the invention was carried out.

Five of the above-described test substrates whose defect position was located were each placed in the spin cleaning and drying machine and cleaned by pouring a liter of flowing pure water heated to 80° C. on the test substrate per minute for ten minutes. Incidentally, in the deaerator, the pressure was reduced by using the vacuum pump. Furthermore, the substrates were then subjected to spin drying at 1000 rpm for 30 seconds.

The numbers of surface defects of the substrates cleaned by the cleaning method of the invention and then dried were measured in the same manner as described above. The results revealed that the numbers of defects which were of a size of 0.06 μm to 0.1 μm and were newly generated in the five test substrates in the position other than the position of the defect located before testing were 1, 2, 2, 2, and 1, respectively.

Comparative Example 2

Five test substrates whose defect position was located were used and treated under the same conditions as the pure water cleaning and drying performed in Example 2 by using the same apparatus, except that the deaerator of the pure water supply line used in Example 2 was not provided, and therefore no deaerating process was performed. That is, the substrates were cleaned by using pure water which had not been subjected to deaeration and had been subjected simply to heating and removal of foreign matter, and then dried.

Incidentally, at this time, the content of oxygen in the pure water obtained from the nozzle of the spin drying machine was on the order of 8 ppm, and the temperature of the pure water was 80° C.

Then, the numbers of surface defects of the substrates were measured in the same manner as described above. The results revealed that the numbers of defects which were of a size of 0.06 μm to 0.1 μm and were newly generated in the five test substrates in the position other than the position of the defect located before testing were 56, 62, 29, 41, and 50, respectively.

Comparative Example 3

Five test substrates whose defect position was located were used and treated under the same conditions as the pure water cleaning and drying performed in Example 2 by using the same apparatus, except that the deaerator of the pure water supply line used in Example 2 was not provided, the heating unit was not provided, and therefore no deaerating process and no heating process were performed. That is, the substrates were cleaned by using pure water which had not been subjected to deaeration and heating and had been subjected simply to removal of foreign matter, and then dried.

Incidentally, at this time, the content of oxygen in the pure water obtained from the nozzle of the spin drying machine was on the order of 8 ppm. Moreover, the temperature of the pure water was 23° C.

Then, the numbers of surface defects of the substrates were measured in the same manner as described above. The results revealed that the numbers of defects which were of a size of 0.06 μm to 0.1 μm and were newly generated in the five test substrates in the position other than the position of the defect located before testing were 2, 1, 3, 3, and 1, respectively.

As is clear from a comparison on the number of defects after drying the substrate between Example 2 in which the cleaning method of the invention performing the heating process and the deaerating process was carried out and Comparative Example 2 in which, although the heating process was performed, no deaerating process was performed, Example 2 can achieve a greater reduction in the number of defects.

The reason is as follows. By performing the deaerating process in addition to the heating process as in Example 2, it is possible to prevent a particle from being generated after drying the substrate, the particle which tends to be generated when pure water, which is a cleaning fluid, is heated.

Moreover, as is clear from a comparison between Example 2 and Comparative Example 3 in which no deaerating process and no heating process were performed, the numbers of defects of Example 2 and Comparative Example 3 are about the same value.

In Example 2 in which the invention was carried out, unlike Comparative Example 2 in which only heating was performed, the number of defects is not increased, and it is possible to reduce the number of defects to the same degree of Comparative Example 3 in which the generation of a particle is naturally inhibited due to the absence of heating.

Furthermore, the substrates subjected to cleaning and drying of Example 2 and Comparative Examples 2 and 3, respectively, were each put in a quartz cell with 100 ml of pure water and immersed under water, and ion extraction was performed at 90° C. for 60 minutes. In addition, the extract thus obtained was subjected to ion chromatography (using DX-500 manufactured by Nippon Dionex K.K.), whereby quantification of sulfate ions in the extract was performed.

The amount of sulfate ions in Example 2 was about ⅓ of that of Comparative Example 2, and was about ¼ of that of Comparative Example 3. That is, it is apparent that Example 2 in which the cleaning method of the invention was carried out could remove far more sulfate ions remaining on the substrate surface by cleaning than Comparative Examples 2 and 3.

As described above, the cleaning method of the invention makes it possible to remove the sulfate ion attached to the substrate surface efficiently, and inhibit significantly the generation of a particle which would be generated after drying the cleaned substrate.

Example 3

An apparatus (a cleaning apparatus) that can clean a photomask substrate by supplying a cleaning fluid to a spin cleaning and drying machine and perform spin drying of the substrate was used, and the cleaning fluid supplying apparatus 201 of the invention shown in FIG. 4 was placed 30 cm upstream of the cleaning apparatus in a cleaning fluid supply line for supplying the cleaning fluid to the cleaning apparatus. At this time, a fluoroplastic-treated air operated valve (manufactured by Advance Electric Co., Inc.) for conveying the cleaning fluid in conjunction with the cleaning process of the cleaning apparatus was placed downstream of the supply pipe, and two stop valves were placed downstream of the discharge pipe.

Next, the amount of discharge was adjusted by, while keeping open one stop valve placed downstream of the discharge pipe, using the other stop valve so that, when the air operated valve placed downstream of the supply pipe was opened, a liter of cleaning fluid was supplied from the supply pipe per minute and a liter of cleaning fluid was discharged from the discharge pipe per minute. Moreover, when the cleaning fluid was not used, interruption of the discharge was made possible by closing the stop valve which had been kept open.

Next, as a substrate to be cleaned, twenty quartz substrates, each having a 26 nm light shielding film made of CrN (Cr:N=9:1 (atomic ratio)) and a 20 nm antireflection film made of CrON (Cr:N:O=4:5:1 (atomic ratio)) formed on a principal surface thereof by sputtering, were prepared, and a defect of each substrate was analyzed by using MAGICS manufactured by Lasertec Corporation, whereby the positions of a defect of 0.08 μm or more but less than 0.1 μm, a defect of 0.1 μm or more but less than 0.2 μm, and a defect of 0.2 μm or more were located.

Next, as shown in FIG. 4(B), the orientation of the cleaning fluid supplying apparatus was held so that the height position of the inlet of the discharge pipe was above the height position of the inlet of the supply pipe, and the discharge of the cleaning fluid was started by opening the stop valve which had interrupted the discharge from the discharge pipe. Then, the substrate whose defect position was located was mounted on the spin cleaning and drying machine, and, after a lapse of 5 seconds from the start of the discharge of the cleaning fluid, the substrate was cleaned by supplying a liter of ultrapure water which had passed through the above-described cleaning fluid supplying apparatus per minute for ten minutes, and was then subjected to spin drying at 1000 rpm for 30 seconds.

That is, the cleaning method of the invention was carried out.

After the above-described cleaning operation was performed on each of the twenty prepared substrates, the substrates were inspected again for defects, and a defect newly generated in a different position was measured.

The total numbers of defects newly observed in all the twenty substrates were as follows. The number of defects of 0.08 μm or more but less than 0.1 μm was 7 (0.35/substrate), the number of defects of 0.1 μm or more but less than 0.2 μm was 2 (0.1/substrate), and the number of defects of 0.2 μm or more was 2 (0.1/substrate).

These numbers are smaller than those of Comparative Example 4, which will be described below. In particular, the number of defects of 0.08 μm or more but less than 0.1 μm in Example 3 is far smaller than that of Comparative Example 4. This is considered to be due to the invention that helped prevent the substrate from being cleaned by the cleaning fluid containing a fine bubble.

Comparative Example 4

Twenty substrates whose defect position was located, the substrates each having the above-described chromium film formed thereon, were cleaned with ultrapure water in just the same manner as in Example 3, except that, unlike the apparatus used in Example 3, an apparatus having no discharge pipe was used and a cleaning fluid was not discharged from the discharge pipe. That is, cleaning was performed by the conventional cleaning method. Then, the substrates were subjected to spin drying, and a defect newly generated in a different position was measured.

The total numbers of defects newly observed in all the twenty substrates were as follows. The number of defects of 0.08 μm or more but less than 0.1 μm was 28 (1.4/substrate), the number of defects of 0.1 μm or more but less than 0.2 μm was 3 (0.15/substrate), and the number of defects of 0.2 μm or more was 6 (0.3/substrate).

As compared to Example 3, in particular, the number of defects of 0.08 μm or more but less than 0.1 μm was increased.

Example 4

An apparatus that can clean a photomask substrate by supplying a cleaning fluid to a spin cleaning and drying machine and perform spin drying of the substrate was used, and the cleaning fluid supplying apparatus 301 as shown in FIG. 5, the cleaning fluid supplying apparatus 301 having a cleaning fluid inlet and a bubble removal pipe which were provided in a housing and having a supply pipe for conveying the cleaning fluid to the point of use and a discharge pipe for discharging the cleaning fluid building up in a filter housing, the supply pipe and the discharge pipe provided on the downstream side of a filter, was placed 30 cm upstream of the apparatus in a cleaning fluid supply line for supplying the cleaning fluid to the apparatus.

Downstream of the supply pipe, an air operated valve for conveying the cleaning fluid in conjunction with the cleaning process was placed. Downstream of the discharge pipe and the bubble removal pipe, air operated valves that were able to operate in conjunction with the air operated valve of the supply pipe for conveying the cleaning fluid to the point of use were placed, respectively, and the outlets thereof were each provided with a stop valve for an adjustment of the amount of discharge.

Furthermore, the air operated valves placed downstream of the discharge pipe and the bubble removal pipe were adjusted so as to be closed concurrently with the start of the supply of the cleaning fluid, and the supply to the point of use was adjusted so that a liter of cleaning fluid was supplied thereto per minute. Moreover, the air operated valves placed downstream of the discharge pipe and the bubble removal pipe were adjusted so as to be opened concurrently when the air operated valve placed downstream of the supply pipe was closed, and the discharge was adjusted so that 0.5 liter of cleaning fluid was discharged from each of the discharge pipe and the bubble removal pipe. When the apparatus was not used, all the solenoid valves were made to be closed.

That is, cleaning was performed by the cleaning method of the invention.

Next, fifty substrates whose defect position was located, the substrates each having the above-described chromium film formed thereon as in Example 3, were cleaned with ultrapure water by using the above-described cleaning fluid supplying apparatus and a spin cleaning and drying machine having a cleaning fluid supply and discharge control system, and the substrates were subjected to spin drying. Then, a defect newly generated in a different position was measured.

The total numbers of defects newly observed in all the fifty substrates were as follows. The number of defects of 0.08 μm or more but less than 0.1 μm was 16 (0.32/substrate), the number of defects of 0.1 μm or more but less than 0.2 μm was 1 (0.02/substrate), and the number of defects of 0.2 μm or more was 2 (0.04/substrate). As is the case with Example 3, the number of increased defects was far smaller than that of Comparative Example.

It is to be understood that the present invention is not limited in any way by the embodiment thereof described above. The above embodiment is merely an example, and anything that has substantially the same structure as the technical idea recited in the claims of the present invention and that offers similar workings and benefits falls within the technical scope of the present invention.

What is claimed is:

1. A method for cleaning a substrate to be cleaned by supplying a cleaning fluid to a cleaning apparatus, the method comprising:
   discharging a built up cleaning fluid, which is built up in a space located on a downstream side of a filter in a cleaning fluid supplying apparatus and filtered by the filter, outside of a system through a discharge pipe;
   after discharging the built up cleaning fluid, supplying a filtered cleaning fluid to a cleaning apparatus through a supply pipe;

cleaning the substrate to be cleaned by filtering the cleaning fluid with the filter for removing foreign matter and supplying the filtered cleaning fluid to the cleaning apparatus through the supply pipe;

discharging the filtered cleaning fluid outside of the system through the discharge pipe, and then continuously discharging the cleaning fluid from the discharge pipe until the filtered cleaning fluid starts to be supplied to the cleaning apparatus through the supply pipe;

after the filtered cleaning fluid starts to be supplied, continuously discharging a portion of the filtered cleaning fluid through the discharge pipe at the same time while supplying another portion of the filtered cleaning fluid through the supply pipe;

when supplying of the filtered cleaning fluid to the cleaning apparatus stops, continuously discharging the filtered cleaning fluid through the discharge pipe; and when one or more substrates are to be cleaned in the cleaning step, continuously discharging the filtered cleaning fluid through the discharge pipe until cleaning of every substrate to be cleaned is completed.

2. The cleaning method according to claim 1, wherein, when the filtered cleaning fluid is supplied to the cleaning apparatus, a height position of an inlet of the discharge pipe is above a height position of an inlet of the supply pipe.

3. The cleaning method according to claim 1, wherein the substrate to be cleaned is any one of a transparent substrate for a photomask, a photomask blank, a photomask blank production intermediate, and a photomask.

4. The cleaning method according to claim 1, wherein ultrapure water is used as the cleaning fluid.

5. The cleaning method according to claim 1, wherein an amount of the cleaning fluid discharged through the discharge pipe is 1/20 to 3 times an amount of the cleaning fluid supplied from the supply pipe.

6. The cleaning method according to claim 5, wherein an amount of the cleaning fluid discharged through the discharge pipe is 1/10 to 2 times an amount of the cleaning fluid supplied from the supply pipe.

* * * * *